United States Patent [19]

Hirao

[11] Patent Number: 4,740,482
[45] Date of Patent: Apr. 26, 1988

[54] METHOD OF MANUFACTURING BIPOLAR TRANSISTOR

[75] Inventor: Tadashi Hirao, Hyogo, Japan

[73] Assignee: Mitsubishi Denki Kabushiki Kaisha, Tokyo, Japan

[21] Appl. No.: 929,368

[22] Filed: Nov. 12, 1986

[30] Foreign Application Priority Data

Nov. 13, 1985 [JP] Japan .................................. 60-257090
Nov. 13, 1985 [JP] Japan .................................. 60-257091
Nov. 13, 1985 [JP] Japan .................................. 60-257092

[51] Int. Cl.$^4$ .................................. H01L 29/72
[52] U.S. Cl. ........................ 437/33; 437/153; 437/162; 357/34
[58] Field of Search .................. 437/33, 153, 162

[56] References Cited

FOREIGN PATENT DOCUMENTS 2157079 3/1985 United Kingdom .

OTHER PUBLICATIONS

"A 2.1-GHz 56-mW Two-Modulus Prescaler IC Using Salicide Base Contact Technology", T. Hirao et al, Extended Abstracts of the 17th Conference on Solid State Devices and Materials, Tokyo, 1985, pp. 381-384.

Primary Examiner—Olik Chaudhuri
Attorney, Agent, or Firm—Lowe, Price, LeBlanc, Becker & Shur

[57] ABSTRACT

A method of manufacturing a semiconductor device in which in order to lead out directly a base electrode (9) from an active base layer (62) through a double layer comprising a first silicon film (601) and a metal silicide film (502), a part of an emitter electrode is formed of a second silicon film (602) and a hole for a contact is provided for forming the metal silicide film (502) for the active base layer (62) utilizing the second silicon film (602) as a mask.

6 Claims, 11 Drawing Sheets

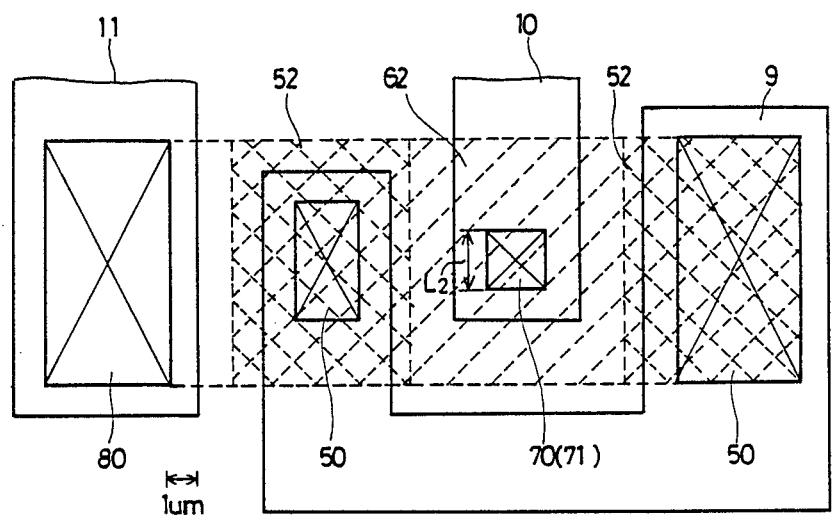

METHOD OF MANUFACTURING BIPOLAR TRANSISTOR

BACKGROUND OF THE INVENTION

1. Field of the Invention

The present invention relates to a method of manufacturing a semiconductor device and more particularly, to an improvement of an electrode lead of a transistor in a bipolar type semiconductor integrated circuit.

2. Description of the Prior Art

A transistor in a bipolar type semiconductor integrated circuit is generally formed in an electrically independent island by an junction isolation, oxide film isolation using a selective oxidation technique, isolation using triple diffusion and the like. A method for forming an npn transistor by oxide film isolation is described herein. However, the method can be adapted to the case where the above described various kinds of isolation other than oxide film isolation are used.

FIGS. 1A to 1E are cross sectional views showing main process steps of a conventional method of manufacturing a semiconductor device. Referring now to the drawings, the manufacturing method is simply described.

In FIG. 1A, an n type (n+ type) layer 2 having a high impurity concentration to be a collector buried layer is selectively formed in a p type (p− type) silicon substrate 1 having a low impurity concentration and then, an n− type epitaxial layer 3 is formed thereon.

In FIG. 1B, selective oxidation is applied utilizing as a mask a nitride film 201 formed on the surface of a pad oxide film 101, so that a thick isolation oxide film 102 is formed in a predetermined region on the surface of the n− type epitaxial layer 3. At the same time, a p type layer 4, a channel stopper, is formed under the isolation oxide film 102.

In FIG. 1C, both the nitride film 201 utilized as a mask for selective oxidation and the pad oxide film 101 are removed to form a protecting oxide film 103 for protecting against ion implantation and then, the p+ type layer 5 to be an external base layer is formed utilizing a photoresist film (not shown in this step) as a mask. In addition, the not-shown photoresist film is removed to form a new photoresist film 301 and then, a p type layer 6 to be an active base layer is formed by ion implantation utilizing the photoresist film 301 as a mask.

In FIG. 1D, the photoresist film 301 is removed, a passivation film 401 comprising a phosphosilicate glass (PSG) is deposited and then, heat treatment for both annealing the ion implanted base layers 5 and 6 and thermal shrinking of the PSG film 401 is performed, so that an external base layer 51 and an active base layer 61 in the intermediate step are formed. A contact hole 70 for an emitter electrode and a contact hole 80 for a collector electrode are formed on the PSG film 401 and then, an n+ type layer 7 to be an emitter layer and an n+ type layer 8 to be a layer for leading out a collector electrode are formed by ion implantation.

In FIG. 1E, an external base layer 52 and an active base layer 62 are completed by annealing each ion implanted layer, and an emitter layer 71 and a layer 81 for leading out a collector electrode are formed and then, a contact hole 50 for a base electrode is formed. Thereafter, a metal silicide [such as platinum silicide (Pt-Si), palladium silicide (Pd-Si) etc.] film 501 for preventing an electrode from penetrating through is formed in each contact hole 50, 70 and 80 and then, a base electrode interconnection 9, an emitter electrode interconnection 10 and a collector electrode interconnection 11 are formed of a metal having low resistance such as aluminum (Al).

FIGS. 2A, 2B and 2C are plan views showing a pattern of a transistor manufactured by the conventional manufacturing method. FIG. 2A shows a single base structure, corresponding to FIG. 1E, FIG. 2B shows a multi-emitter structure, and FIG. 2C shows a plan view showing a pattern of a transistor having a double base structure.

The frequency characteristic of a transistor depends on base-collector capacitance, base resistance and the like. In order to improve the frequency characteristic, these factors must be reduced. Therefore, in order to reduce base resistance, the p+ type external base layer 52 was provided in the above described structure, which increases base-to-collector capacitance. In addition, base resistance also depends on a distance $D_1$ between the emitter layer 71 and the contact hole for a base electrode 50 as shown in FIG. 2A. Conventionally, the distance was a total distance of a spacing between the base electrode interconnection 9 and the emitter electrode interconnection 10 and a length of a portion where each electrode interconnection 9, 10 is not overlapped with each contact hole 50, 70. Even if the accuracy of photoetching is improved so that a spacing between base electrode interconnections is reduced, some non-overlapped portion is still left. Furthermore, it is well known that in order to reduce base resistance and improve current driving capacity, a multi-emitter structure as shown in FIG. 2B may be used. The emitter length $L_2$ shown in FIG. 2B may be slightly smaller as compared with the emitter length $L_1$, since only the edge portion of an emitter opposed to a base electrode functions in high current and high frequency operation.

In order to reduce base resistance, a double base structure as shown in FIG. 2C may also be used. In this structure, the emitter length $L_2$ may be small similarly to the multi-emitter structure. However, the multi-emitter structure requires a base electrode between each emitter, and the double base structure must have a base region formed on both sides of an emitter region. Therefore, both the structures have a disadvantage that the base area and the base electrode interconnection region are increased.

As the prior art related to the present invention, an article by T. Hirao, who is an inventor of the present invention, et al., entitled "A 2.1-GHz 56mW Two-Modulus Prescaler IC Using Salicide Base Contact Technology", Extended Abstracts of the 17th Conference on Solid State Devices and Materials, Tokyo, 1985, pp. 381–384 is known. The prior art discloses that base resistance and base capacitance in a base contact of a bipolar transistor are reduced by SCOT (Salicide Bas Contact Technology) process.

SUMMARY OF THE INVENTION

An object of the present invention is to eliminate a disadvantage of the above described prior art and to provide a method of manufacturing a semiconductor device, which can reduce at least emitter resistance, as well as base resistance and base collector capacitance, which can reduce the base area in a multi-emitter structure and a double-base structure, and which does not increase base collector capacitance.

In a method of manufacturing a semiconductor substrate according to the present invention, a base electrode is directly led out from an active base layer through a double layer comprising a first silicon film and a metal silicide film, a part of an emitter electrode is formed of a second silicon film, and a contact hole is provided for forming the metal silicide film for the active base layer utilizing the second silicon film as a mask.

In addition, in a multi-emitter structure, a plurality of emitter layers are formed in a base layer and no specific base electrode is provided between each emitter layer.

Furthermore, in a double base structure, the first silicon film to be a base electrode is formed extending over an isolation region from both sides of an emitter region and a contact hole for an emitter electrode is provided, not on an emitter layer but on an inactive region.

According to the present invention, it is not necessary to include a distance extending from a contact hole for a base electrode in the base electrode and a distance extending from a contact hole for an emitter electrode in the emitter electrode, as a distance between the contact hole for a base electrode and the emitter layer, so that the above described distance can be reduced and hence base resistance can be lowered. In addition, an external base layer having a high impurity concentration is not provided, so that base-collector capacitance is not increased. An emitter electrode is formed of the second silicon film and the metal silicide film, so that emitter resistance can be lowered.

In addition, in a multi-emitter structure, metal silicide film is formed around (except for one direction) each emitter layer and the metal silicide film is connected to the base electrode, and hence, it is not necessary to provide a specific base electrode between each emitter layer, so that the base area can be reduced.

Furthermore, in a double base structure, the first silicon film to be a base electrode on both sides of the emitter layer is formed extending over the surface of the isolation region from a part of the surface on both sides of the emitter layer in the base layer, so that the base area can be reduced. Since the second silicon film connected to the emitter layer can be made to be low resistance in the metal silicide film, an emitter electrode interconnection can be formed by leading out, not on the emitter layer but in the inactive region.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 2C is a plan view showing a pattern of a transistor having a double base structure formed using the conventional manufacturing method;

DETAILED DESCRIPTION OF THE PREFERRED EMBODIMENTS

Figure 1A:
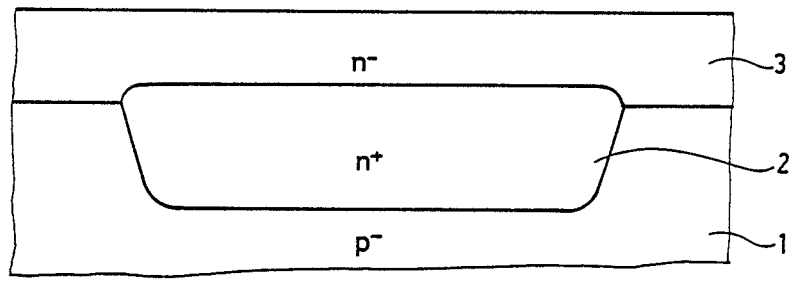
FIGS. 1A to 1E are cross sectional views showing main processes in a conventional method of manufacturing a semiconductor device.

Referring now to the accompanying drawings, embodiments of the present invention are described. Description for portions overlapping with the description of the prior art are properly omitted. In all the drawings, portions identical or corresponding to the portions shown in FIGS. 1A to 1E have identical reference numerals. First, a method of manufacturing a bipolar transistor having a single base structure is described.

FIGS. 3A to 3I are cross sectional views showing main manufacturing processes of the bipolar transistor device having a single base structure of an embodiment according to the present invention. Referring now to FIGS. 3A to 3I, a method of manufacturing a semiconductor device of an embodiment according to the present invention is described.

Figure 1B:
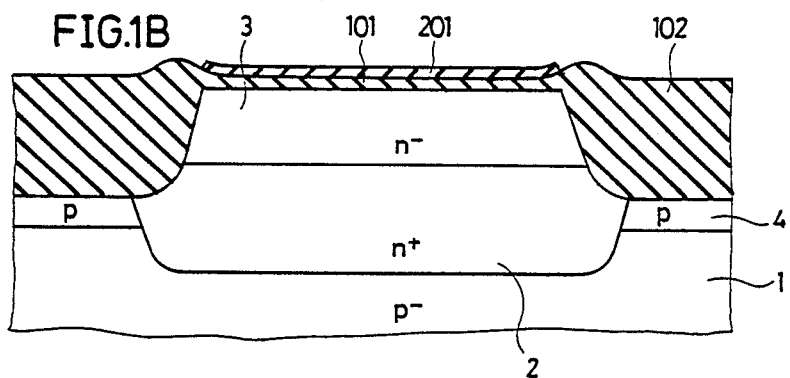
Figure 1C:
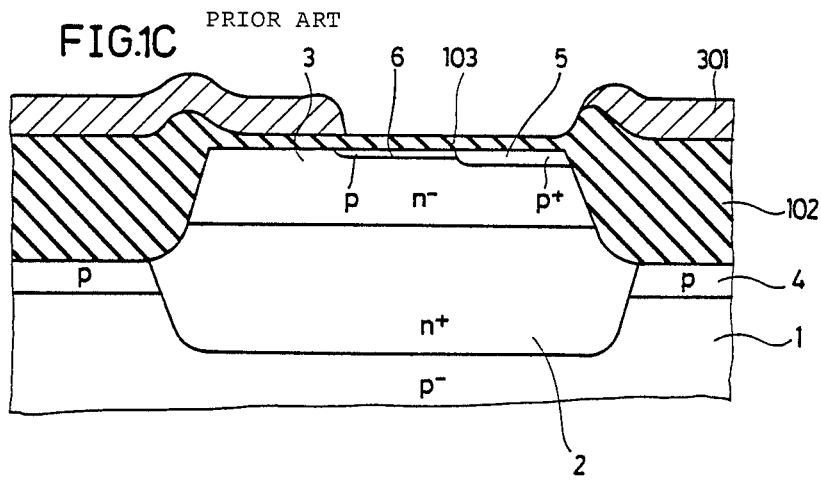
Figure 1D:
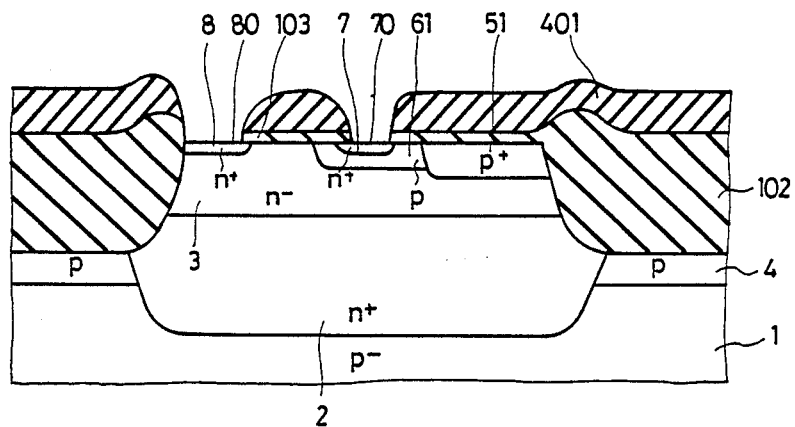
Figure 1E:
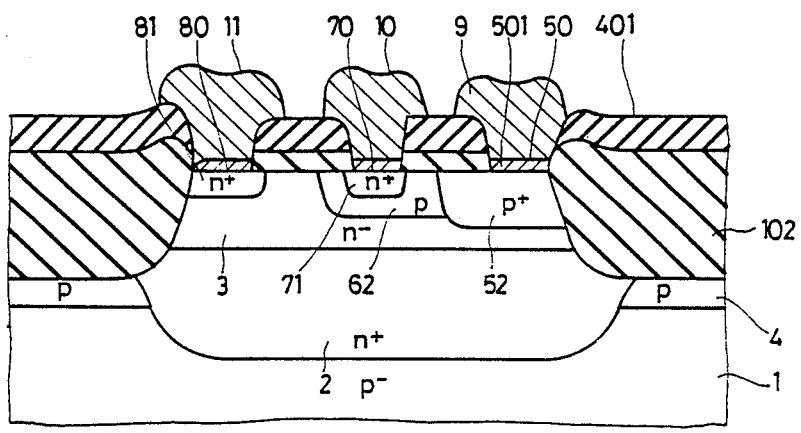
Figure 3A:
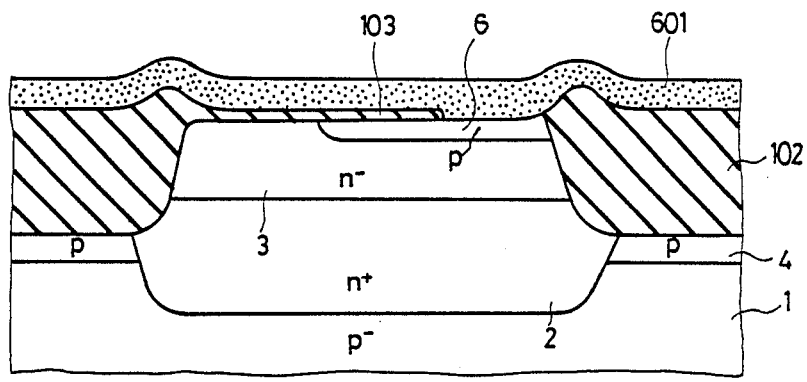
FIGS. 3A to 3I are cross sectional views showing main processes in a method of manufacturing a semiconductor device of an embodiment according to the present invention.

In FIG. 3A, similarly to a conventional manufacturing method, an n+ type collector buried layer 2, an n− type epitaxial layer 3, an oxide film 102 for isolation and a p type layer 4, as a channel stopper are formed on a p− type silicon substrate 1 and then, a nitride film 201 and a pad oxide film 101 shown in FIG. 1B are removed and an oxide film 103 protecting against ion implantation is formed. Thereafter, a p type layer 6 to be an active base layer is formed through a photoresist mask (not shown) by ion implantation and then, the oxide film 103 in the neighborhood of a region to be a contact hole for the base electrode is removed. In addition, a polysilicon film 601 is deposited to the entire surface including the removed portion.

Figure 3B:
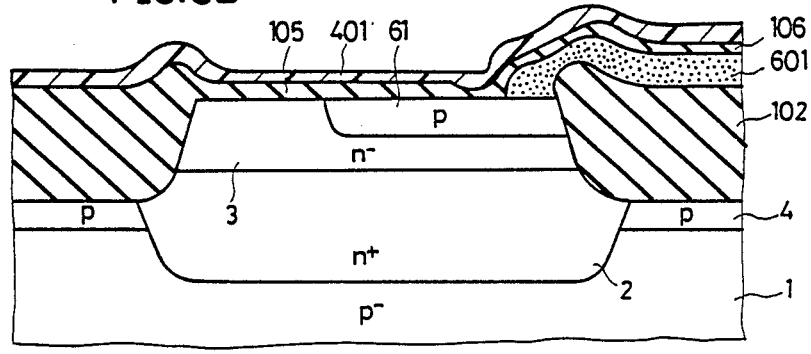

In FIG. 3B, p type impurities are introduced into the entire surface of the polysilicon film 601 and then, sintering is performed so that a p type layer 6 becomes an active base layer 61 in an intermediate step. Thereafter, the polysilicon film 601 is selectively removed by etching. Oxidation is then performed, so that an oxide film 105 is formed in the position of the removed oxide film 103 and an oxide film 106 is formed on the surface of the remaining polysilicon film 601. In addition, a PSG film 401 is formed on the entire surface. Meanwhile, the following processes may be used, wherein the polysilicon film 601 for leading out a base electrode and the oxide film 106 are formed and then, ion implantation into an active base layer is performed utilizing the oxide film 106 as a protecting mask against ion implantation and subsequently, the PSG film (a CVD film which does not contain impurities such as a phosphorus may be used depending on the process) may be formed and sintered.

Figure 3C:
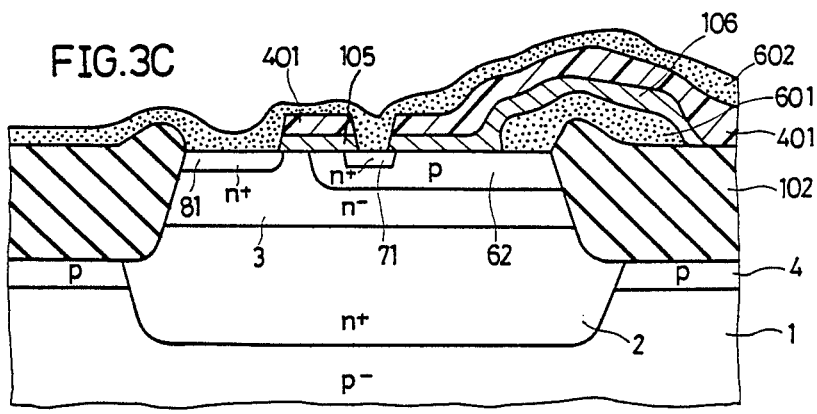

In FIG. 3C, the oxide film 105 and the PSG film 401 on a region to be an emitter layer and a layer for leading out a collector electrode are removed by selective etching utilizing a photoresist mask (not shown) and then, a polysilicon film 602 is deposited on the entire surface. Thereafter, after ion implantation of n type impurities into the polysilicon film 602 at a high concentration, n type impurities are diffused from the polysilicon film 602 by driving, so that an n+ type layer 71 to be an emitter layer and an n+ type layer 81 to be a layer for leading out a collector electrode are formed.

Figure 3D:
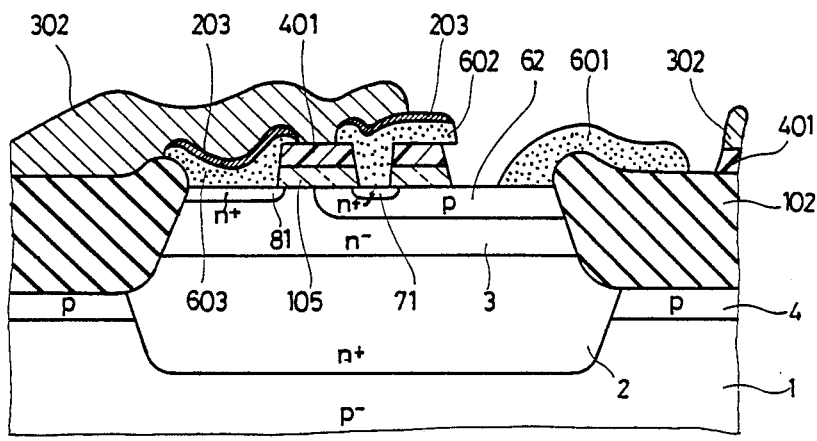

In FIG. 3D, a nitride film 203 is formed on the surface of the polysilicon film 602 by a reduced pressure CVD method or the like and then, selective etching is performed so that only a part of the polysilicon films 602 and 603 as a diffusing source and the nitride film 203 formed thereon are left. A hole for a base contact is then provided utilizing a resist film 302 as a mask. At that time, the resist film 302 is formed in such a manner that a portion of the polysilicon film 602 for forming an emitter layer is exposed. The oxide film 106 and the PSG film 401 on the polysilicon film 601 connected to the base contact are etched away utilizing the exposed polysilicon film 602 as a mask. In addition, when the oxide film etching is performed by an anisotropic etching such as a RIE (reactive ion etching) method, a resist film utilized in selectively etching the polysilicon films 602 and 603 is left, so that the nitride film 203 and the polysilicon films 602 and 603 can be prevented from decreasing at the time of oxide film etching. Meanwhile, the polysilicon film 603 is also left on the surface of the layer 81 for leading out a collector electrode. However, since impurities have been already diffused in the layer 81 for leading out a collector electrode, the polysilicon film 603 can be also removed.

Figure 3E:
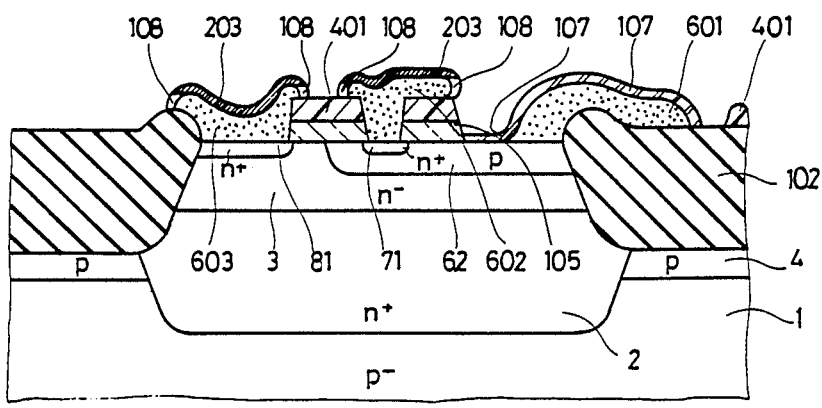

In FIG. 3E, a thick oxide film 108 is formed on the side walls of the polysilicon films 602 and 603 on the n+ layers 71 and 81 and a thin oxide film 107 is formed on the surfaces of a p type active base layer 62 and the p+ type polysilicon film 601. As is well known, this utilizes the fact that for silicon and polysilicon having n type impurities such as phosphorus and arsenic at a high concentration, oxidation is performed at an increased speed when oxidation temperature is lower.

Figure 3F:
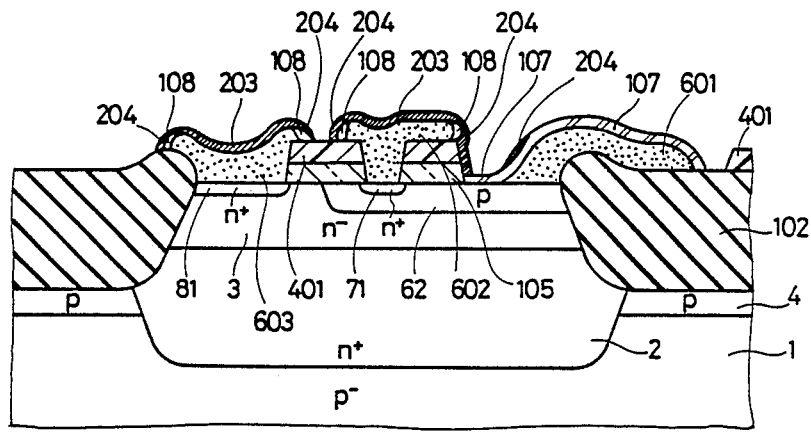

In FIG. 3F, a nitride film is formed on the surface by the reduced pressure CVD method or the like and then, an anisotropic etching is performed on the entire surface utilizing RIE (Reactive Ion Beam Etching) process or the like, so that a nitride film 204 is left only on the side walls of the oxide films 107 and 108.

Figure 3G:
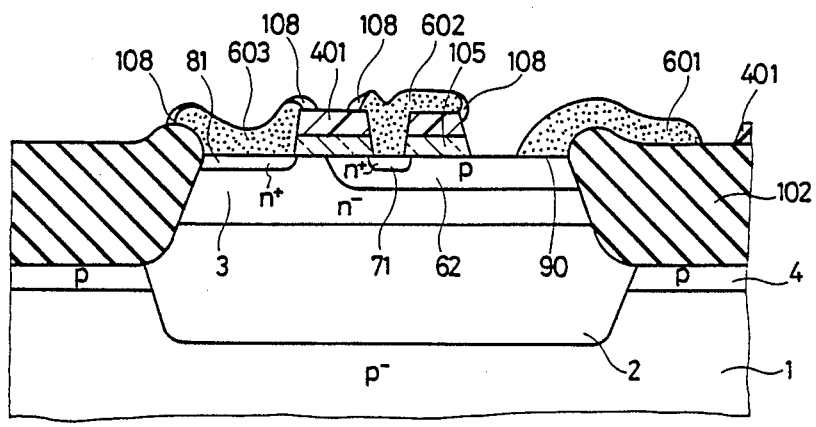

In FIG. 3G, oxide film etching is formed to remove all of the nitride films 203 and 204, and further the thin oxide film 107 left on the surface of the polysilicon film 601 is washed out, so that the surfaces of the polysilicon films 601, 602 and 603 are exposed. The nitride film 204 is formed on the side walls of the polysilicon films 602 and 603 in order to prevent decreasing in thickness the thick oxide film 108 formed on the side walls of the polysilicon films 602 and 603 when the thin oxide film 107 on the surface of the polysilicon film 601 is washed out. In addition, instead of forming the nitride film 204, the thin oxide film 107 can also be washed out by the RIE process, so that the manufacturing process can be simplified. However, care must be taken to control the accuracy of etching.

Figure 3H:
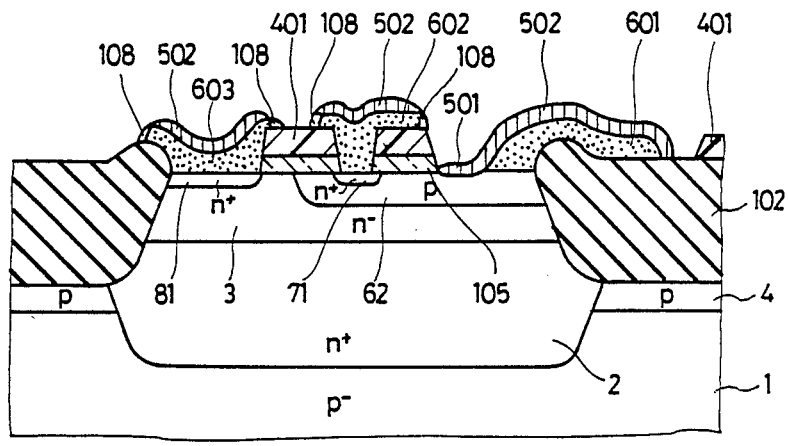

In FIG. 3H, a metal layer (not shown) formed of metal such as Pt, Pd, Ti, W, Mo (which forms a metal silicide between silicon and polysilicon films and the metal layer) is formed on the entire surface by vapor deposition and sputtering and then, metal silicide films 501 and 502 are formed on the exposed surface of the active base layer 62 and the surfaces of the polysilicon films 601, 602 and 603 by sintering. Then the metal layer is etched away with aqua regia or the like so that the metal silicide films may be left.

Figure 3I:
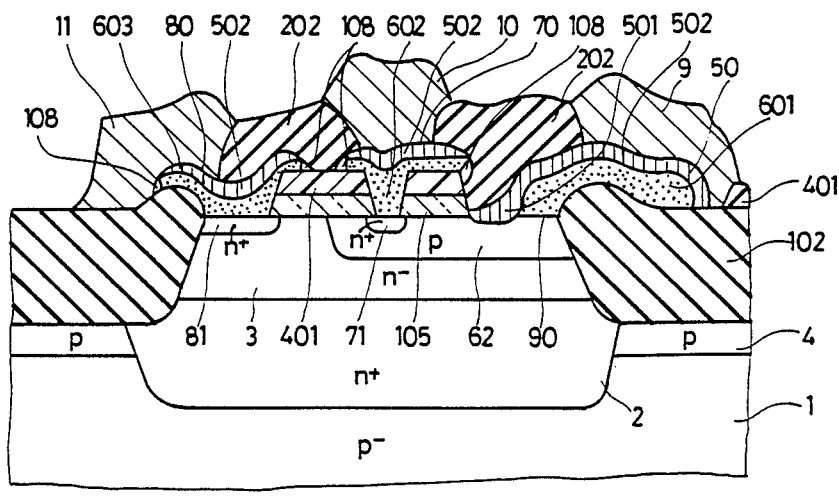

In FIG. 3I, after formation of a nitride film 202 for passivation (or an oxide film), selective etching is applied to the nitride film 202, so that a contact hole 50 for a base electrode, a contact hole 70 for an emitter electrode and a contact hole 80 for a collector electrode are formed. Thereafter, a base electrode interconnection 9, an emitter electrode interconnection 10 and a collector electrode interconnection 11 are formed of a low resistance metal such as an aluminum (Al), respectively.

Figure 4:
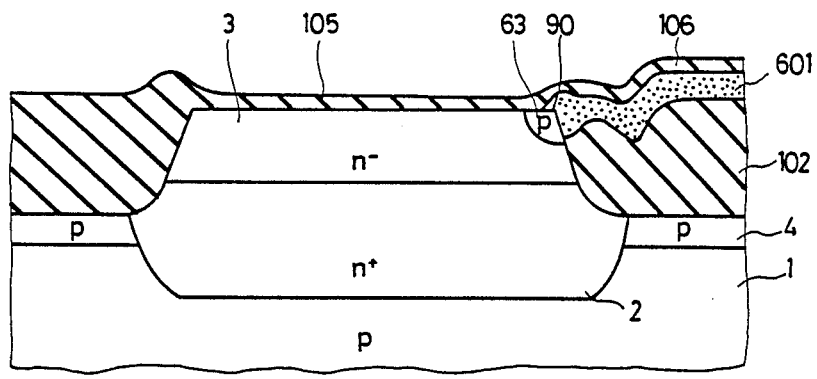
FIG. 4 is a cross sectional view showing a main process in a manufacturing method of another embodiment of the present invention.

In accordance with another embodiment, in forming the polysilicon film 601 to be a part of a base electrode, the polysilicon film 601 comes into contact with the side wall of a silicon island 3 by excessively etching the oxide film 103 shown in FIG. 3A, as shown in FIG. 4, so that a contacting surface 90 between the polysilicon film 601 shown in FIG. 3G and the active base layer 62 may be small, whereby the base area can be reduced. In etching the oxide film 103, it is the most desirable from the view point of breakdown voltage that a diffused layer 63 from the polysilicon film 601 is approximately as deep as the active base layer 62. The polysilicon film 601 is formed before formation of the active base layer 62, so that the depth of the active base layer 62 can be controlled and the prevention of a crystal defect in the active base layer can be improved.

Figure 2A:
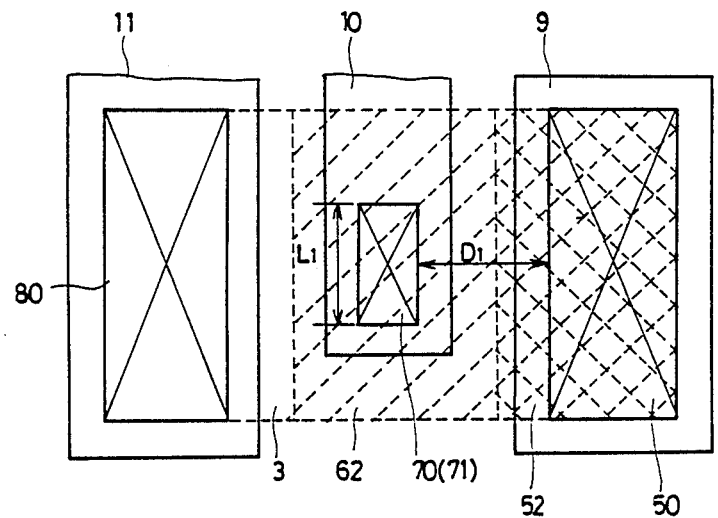
FIG. 2A is a plan view showing a pattern of a transistor formed using the conventional manufacturing method.
Figure 2B:
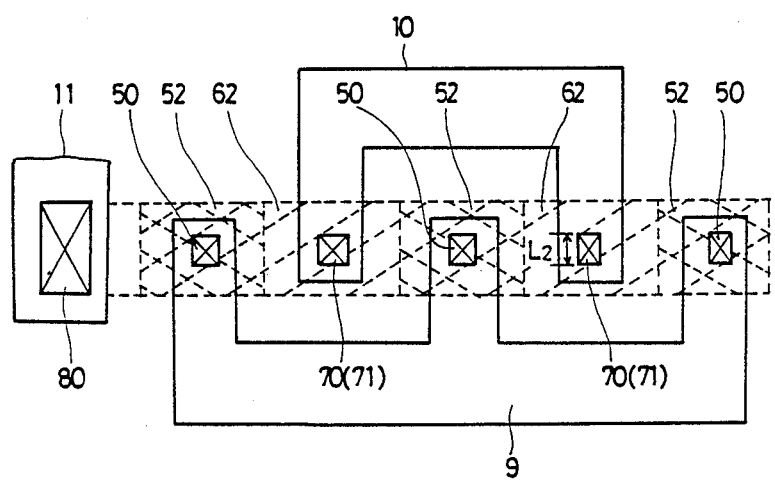
FIG. 2B is a plan view showing a pattern of a transistor having a multi-emitter structure formed using the conventional manufacturing method.
Figure 5:
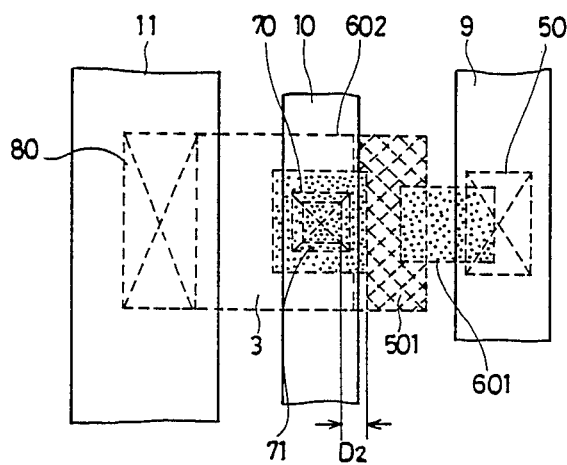
FIG. 5 is a plan view showing a pattern of a transistor having a single base structure formed using the manufacturing method of the present invention.

FIG. 5 is a plan view showing a pattern of thus structured transistor, compared to FIG. 2A. Since a distance $D_2$ between the emitter layer 71 and the metal silicide film 501 connected through the polysilicon film 601 to the base electrode 9 depends on the superposed portion of a window portion (corresponding to the reference numeral 71) for diffusing and a polysilicon film 602 to be a diffusing source, the distance $D_2$ can be reduced as compared with the distance $D_1$ shown in FIG. 2A, so that base resistance is reduced by the resultant difference. In addition to such reduction of base resistance, base resistance is further reduced, since the metal silicide film 501 having a low resistivity (a few $\Omega/\square$ to a few tens $\Omega/\square$) is used instead of the conventional p+ type external base layer 52 (a few tens $\Omega/\square$ to 100$\Omega/\square$). Furthermore, since a collector electrode is formed of the polysilicon film 603 and the metal silicide film 502 and an emitter electrode is formed of a polysilicon film 602 and a metal silicide film 502, collector resistance is reduced, so that collector resistance and emitter resistance can be reduced. Additionally, since the p+ type external base layer 52 is not used and the active base layer 62 itself is slightly reduced, base-collector capacitance is also reduced. As a result, the frequency characteristic of the transistor can be improved.

Figure 6:
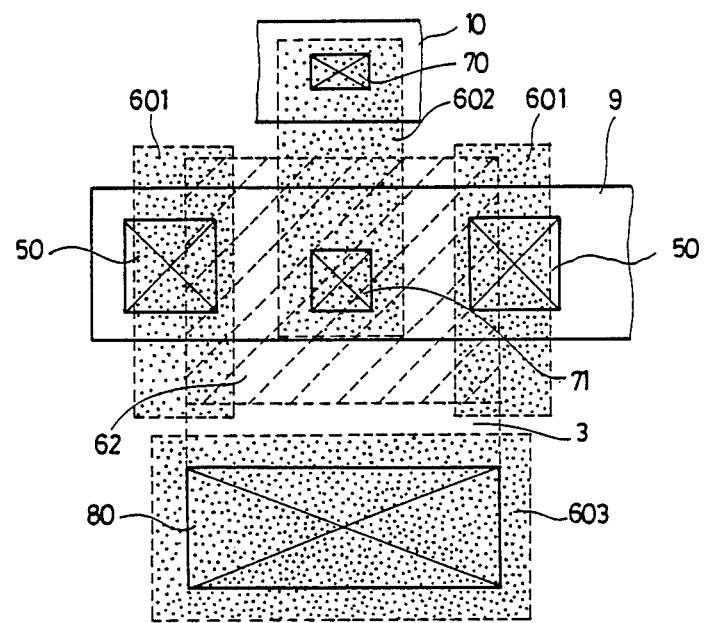
FIG. 6 is a plan view showing a pattern of a transistor having a double base structure formed using the manufacturing method of the present invention.

FIG. 6 is a plan view showing a pattern of a transistor having a double base structure formed using a method of manufacturing a semiconductor device according to the present invention. A transistor device having a double base structure shown in FIG. 6 is formed in accordance with the manufacturing process shown in FIGS.

3A to 3I. However, in a double base structure shown in FIG. 6, a double layer comprising the polysilicon film 602 and the metal silicide film 502 on the emitter layer 71 is connected to the emitter electrode interconnection 10, not on the emitter layer 71 but in an inactive region, so that selective etching of the polysilicon films 602 and 603 and the overlying nitride film 203 in the process shown in FIG. 3D is performed such that the polysilicon films 602 and 603 and the overlying nitride film 203, and a portion connected to a low resistance metal interconnection in the inactive region of the polysilicon film 602 connected to the emitter layer are left.

Figure 7:
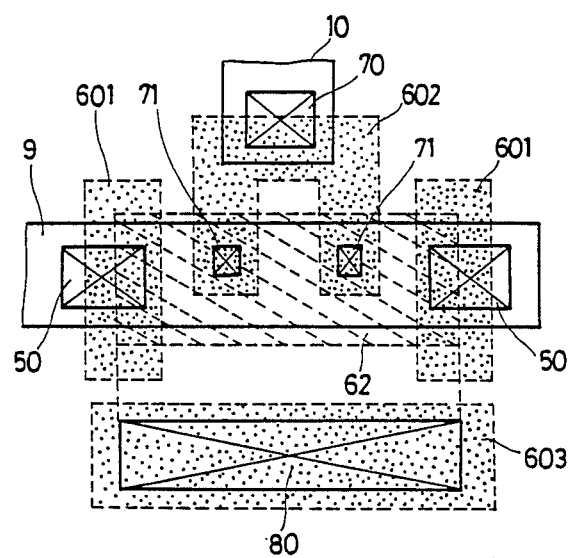
FIG. 7 is a plan view showing a pattern of a transistor having a multi-emitter structure formed using the manufacturing method of the present invention.

FIG. 7 is a plan view of a pattern of a transistor device having a multi-emitter structure of another embodiment according to the present invention. The transistor device having a multi-emitter structure shown in FIG. 7 is also formed in accordance with the manufacturing method shown in FIGS. 3A to 3I. However, in the multi-emitter structure shown in FIG. 7, a double layer comprising the polysilicon film 602 and the metal silicide film 502 connected to a plurality of emitter layers 71 are connected to the emitter electrode interconnection 10, not on the emitter layer 71 but on the inactive region. Therefore, in selective etching in the method shown in FIG. 3D, the polysilicon films 602 and 603 and the overlying nitride film 203, a polysilicon film and a nitride film led out from a plurality of the emitter layers 71 and connected to a low resistance metal interconnection on the inactive region, and a polysilicon film and a nitride film between a plurality of the emitter layers adjacent to each other are left. As a result, the metal silicide film 501 is formed around (except for one direction) each emitter layer so as to be connected to the polysilicon films 601 to be base electrodes on both sides.

Figure 8A:
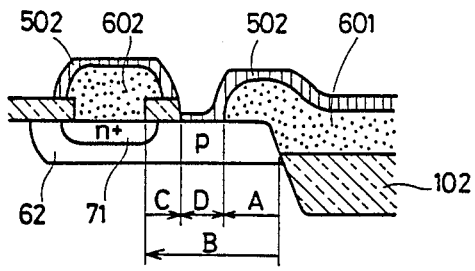
FIGS. 8A to 8C are diagrams showing variation of a distance $D_2$ between an emitter region and a base electrode, depending on the accuracy of superposition.
Figure 8B:
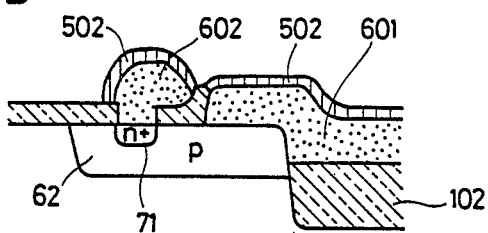
Figure 8C:
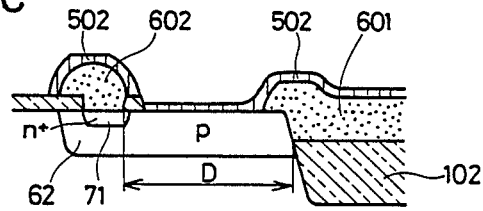
Figure 9:
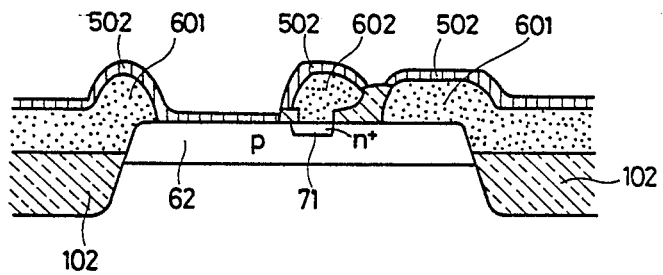
FIG. 9 is a diagram showing a relation between the accuracy of mask alignment of photolithography in the transistor having a double base structure and a distance between an emitter layer and a base electrode.

In the manufacturing process of a transistor having a single base structure, since the polysilicon film 601 to be a base electrode is aligned to an isolation edge (an arrow A), emitter contact is also aligned to the isolation edge (an arrow B), and the polysilicon film 602 is aligned to a contact (an arrow C), the spacing D between polysilicon films ($D_2$-C in FIG. 3A) depends on the accuracy of superposition of masks in photolithography and can largely change from 0 to three times the spacing in the normal case, as in the worst case shown in FIGS. 8B and 8C. Therefore, the double base structure is used as shown in FIG. 6, so that the distance $D_2$ between a base electrode and emitter diffusion can be in a designed range even if photolithography becomes the worst as shown in FIG. 9. In addition, unlike the conventional double base structure, the polysilicon films 601 to be base electrodes on both sides are formed extending over the surface of an isolation region from a part of the surface on both sides of the emitter layer 71 within the active base layer 62 to reduce the base area as shown in FIG. 6, so that the collector electrode 603 is formed in the position opposed to the base and the emitter. Furthermore, the polysilicon film 602 connected to the emitter layer 71 extends to the surface of the inactive region in which the contact hole 70 for an emitter electrode is provided. Since the polysilicon film 602 is made to be low resistance by the metal silicide film, interconnection becomes possible, not on the emitter layer 71 but by leading out onto the inactive region, so that the area for a transistor is not significantly increased even in the double base structure.

Additionally, unlike the conventional double base structure, even in a multi-emitter structure as shown in FIG. 7, the metal silicide film 501 having low resistance is formed around (except for one direction) the emitter layer 71 so as to be connected to the polysilicon film 601 to be a base electrode on both sides, so that base resistance can be reduced without increasing the base area. Furthermore, similarly to the double base structure in FIG. 6, the collector electrode 603 is formed in the position opposed to the base layer and the emitter layer. The polysilicon film 602 connected to the emitter layer 71 extends to the surface of the inactive region, in which the contact hole 70 for an emitter electrode is provided. Since the polysilicon film 602 is made to be low resistance by the metal silicide film, interconnection becomes possible, not on the emitter layer 71 but by leading out onto the inactive region, so that the area for a transistor is not significantly increased even in the multi-emitter structure.

In the transistor structure shown in FIGS. 6 and 7, silicon films of the base electrodes on both sides are connected with an aluminum interconnection. However, similar performance can be obtained even if an aluminum electrode interconnection is provided after direct connection by a silicon film which is made to be low resistance by the silicide.

In addition, polysilicon has been used as an impurity diffusing source for the emitter layer and the collector electrode leading out region. However, a similar effect can be obtained even if monocrystal or non-crystal silicon is used.

As described in the foregoing, according to the present invention, a distance between a contact hole for a base electrode and an emitter layer can be decreased and base resistance can be reduced, since a base electrode is formed of a double layer comprising a first silicon film and a metal silicide film on the surface of an isolation region adjacent to a lead active base layer, a part of an emitter electrode is formed of a second silicon film, a hole for a base contact is provided for forming the metal silicide film on the lead active base layer utilizing the second silicon film as a mask. In addition, since at least the emitter electrode is formed of the second silicon film and the metal silicide film, contact resistance is reduced, so that emitter resistance can be reduced. Since an external base layer having a high impurity concentration is not provided, base-to-collector capacitance can be reduced. Furthermore, in the double base structure, the first silicon film is formed extending over the surface of the isolation region from a part of the surface of both sides of the emitter layer within the base layer, so that the base area can be reduced. Since the polysilicon film connected to the emitter layer is made to be low resistance by the metal silicide film, interconnection becomes possible, not on the emitter layer but by leading out into the inactive region.

Additionally, in the multi-emitter structure, the metal silicide film is formed around (except for one direction) each emitter layer, the metal silicide film is connected to the base electrode on both sides, and a specific base electrode is not provided between each emitter layer, so that the base area can be significantly reduced. Therefore, some effects are achieved, such that a transistor having a good frequency characteristic can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device including a base region, an emitter region and a collector region, comprising:

a first step of forming on the surface of a semiconductor substrate (1) a layer (3) of a first conductivity type to be a collector region surrounded with an isolation region (102);

a second step of forming a layer (6, 61, 62) of a second conductivity type to be a base region in a predetermined region on the surface of said layer (3) of the first conductivity type so that one side of said layer of the second conductivity type contacts said isolation region (102);

a third step of forming a first silicon film (601) on adjacent portions of the surface of said layer (6, 61, 62) of the second conductivity type and the surface of said isolation region (102) contacting said layer (6, 61, 62) of the second conductivity type;

a fourth step of forming silicon oxide films (105,106) on the surface of the portion of said layer (6, 61, 62) of the second conductivity type not covered with said first silicon film, and on the surface of said first silicon film (601);

a fifth step of etching away said silicon oxide films (105, 106) selectively to expose the surface of a region (81) for leading out a collector electrode on the surface of said layer (3) of the first conductivity type and to expose the surface of a region (71) to be an emitter layer on the surface of said layer (6, 61, 62) of the second conductivity type;

a sixth step of forming a second silicon film (602) on the surfaces of said exposed regions (71, 81) and the remaining silicon oxide films (105, 106), and introducing impurities of the first conductivity type into said second silicon film (602);

a seventh step of diffusing said impurities of the first conductivity type from said second silicon film (602) to said exposed regions (71, 81) by heat treatment, so as to form the emitter layer (71) and the layer (81) for leading out a collector electrode;

an eighth step of forming a first nitride film (203) on said second silicon film (602) and then etching away selectively said second silicon film (602) and said first nitride film (203), so as to leave said second silicon film (602) and said first nitride film (203) at least on said emitter layer a ninth step of removing selectively said silicon oxide film (106) from the surface of a region for leading out a base electrode on a portion of said layer of the second conductivity type (6,61, 62) not covered by said first silicon film, and from said first silicon film (601) thereby to expose said region for leading out a base electrode and said first silicon film;

a tenth step of concurrently forming a thick silicon oxide film (108) on side walls of said second silicon film (602) at least on said emitter layer (71) and forming a thin silicon oxide film (107) on exposed region for leading out a base electrode, by oxidation treatment;

an eleventh step of removing said first nitride film (203) to expose said second silicon film and removing said thin silicon oxide film (107) to expose said region for leading out a base electrode;

a twelfth step of forming metal silicide films (501, 502) on the surfaces of the exposed region for leading out a base electrode, said exposed first silicon film (601) and said exposed second silicon film (602, 603); and a thirteenth step of forming a protection film (202) on the entire surface, and forming a base electrode (9) on the portion of the metal silicide film on said first silicon film (601) and an emitter electrode (10) and a collector electrode (11) on the portion of the metal silicide film on said second silicon film (602, 603) through openings (50, 70, 80) provided in said protection film (202).

2. A method of manufacturing a semiconductor device in accordance with claim 1, wherein:

in said third step, said first silicon film (601) is formed to extend to said isolation region (102) from the surface of said layer of the second conductivity type on both sides of said emitter layer (71), and in said eighth step, said first nitride film (203) and said second silicon film (602) are selectively etched away to leave a region covering said emitter layer (71) and a region extending continuously from said emitter layer (71) to the emitter electrode (10) located on an inactive region, whereby a transistor having a double base structure in which the base electrode (9) is led out from both sides of the emitter layer (71) is formed.

3. A method of manufacturing a semiconductor device in accordance with claim 1, wherein:

a plurality of said emitter layers (71) are formed in said layer of the second conductivity type (6, 61, 62), in said eighth step, step, said first nitride film (203) and said second silicon film (602) are etched away selectively to leave a region covering each of the plurality of said emitter layers (71), a region extending continously from each of the plurality of said emitter layers (71) to said emitter electrode (10) located on an inactive region, and a region between each of the plurality of said emitter layers (71), whereby a transistor having a multi-emitter structure is formed.

4. A method of manufacturing a semiconductor device in accordance with claim 1, wherein said first silicon film (601) is a polycrystal silicon film having introduced therein impurities of the second conductivity type.

5. A method of manufacturing a semiconductor device in accordance with claim 1, wherein said second silicon film (602, 603) is a polycrystal silicon film.

6. A method of manufacturing a semiconductor device in accordance with claim 1, wherein said eleventh step comprises the steps of forming a second nitride film (204) on the surfaces of said thick oxide film (108) and said first nitride film (203), performing an anisotropic etching of said first and second nitride films (203, 204) to leave the nitride films (203, 204) on the surfaces of said thick oxide film (108) and said second silcon film (602, 603), washing out said thin oxide film (107) and then, removing the remaining nitride films (203, 204).

* * * * *